United States Patent [19]
Gilbert

[11] Patent Number: 5,826,182
[45] Date of Patent: Oct. 20, 1998

[54] DOUBLE BALANCED RF MIXER WITH PREDETERMINED INPUT IMPEDANCE

[75] Inventor: Barrie Gilbert, Portland, Oreg.

[73] Assignee: Analog Devices, Inc., Norwood, Mass.

[21] Appl. No.: 377,752

[22] Filed: Jan. 25, 1995

[51] Int. Cl.[6] .................................................. H04B 01/28
[52] U.S. Cl. .......................... 455/326; 455/330; 455/333; 327/355; 327/359
[58] Field of Search .................................... 455/333, 326, 455/330, 313, 323, 319; 327/355, 356, 358, 359, 113; 329/323, 326; 330/257, 275, 288, 301

[56] References Cited

U.S. PATENT DOCUMENTS

| | | | |
|---|---|---|---|
| 4,344,188 | 8/1982 | Tanabe et al. | 455/333 X |
| 4,723,110 | 2/1988 | Voorman | 330/252 |
| 5,043,674 | 8/1991 | Bonaccio et al. | 330/257 |
| 5,107,134 | 4/1992 | Itoh | 307/254 |
| 5,311,086 | 5/1994 | Yamaji et al. | 327/356 |
| 5,379,457 | 1/1995 | Nguyen | 455/323 |
| 5,495,194 | 2/1996 | Sugawava | 327/355 X |
| 5,497,123 | 3/1996 | Main et al. | 330/257 |

FOREIGN PATENT DOCUMENTS

| | | |
|---|---|---|
| 0040273 | 5/1980 | European Pat. Off. . |
| 109081 | 5/1984 | European Pat. Off. . |

OTHER PUBLICATIONS

Kimura, A Biopolar Four–Quadrant Analog Quarter–Square Multiplier Consisting of Unbalanced Emitter–Coupled Pairs and Expansion of Its Input Ranges, IEEE Journal of Solid–State Circuits, vol. 29, No. 1, Jan. 1994.

Kimura, "Some Circuit Design Techniques Using Two Cross–Coupled, Emitter–Coupled Pairs", IEEE Transactions On Circuits and Systems 1: Fundamental Theory and Applications, vol. 41, No. 5, May 1994 pp. 411–423.

Brokaw, A. Paul, "A Simple Three–Terminal IC Bandgap Reference," IEEE Journal of Solid–State Circuits, vol. SC–9, No. 6, Dec. 1974 pp. 388–393.

*Primary Examiner*—Wellington Chin
*Assistant Examiner*—Philip J. Sobutka
*Attorney, Agent, or Firm*—Marger, Johnson, McCollom & Stolowitz PC

[57] ABSTRACT

A mixer includes a doubly-balanced mixer core, an RF input section coupled to the mixer core, and a biasing circuit coupled to the RF input section. The RF input section includes a first transistor coupled to a first input of the mixer core for supplying a first current thereto. The base of the first transistor is driven by an RF input current, as a result, the first current is responsive to the RF input current. The RF input section also includes a current mirror coupled to the first transistor, which mirrors the sum of the first current and the RF input current to produce a second current that is complementary to the first current for small variations of the RF input current. The current mirror is coupled to a second input of the mixer core to supply the second current thereto. A biasing circuit is coupled to the RF input section to establish a quiescent value of the first current. Padding resistor can also be used in the RF input section to provide a predetermined input impedance to the RF input current.

15 Claims, 6 Drawing Sheets

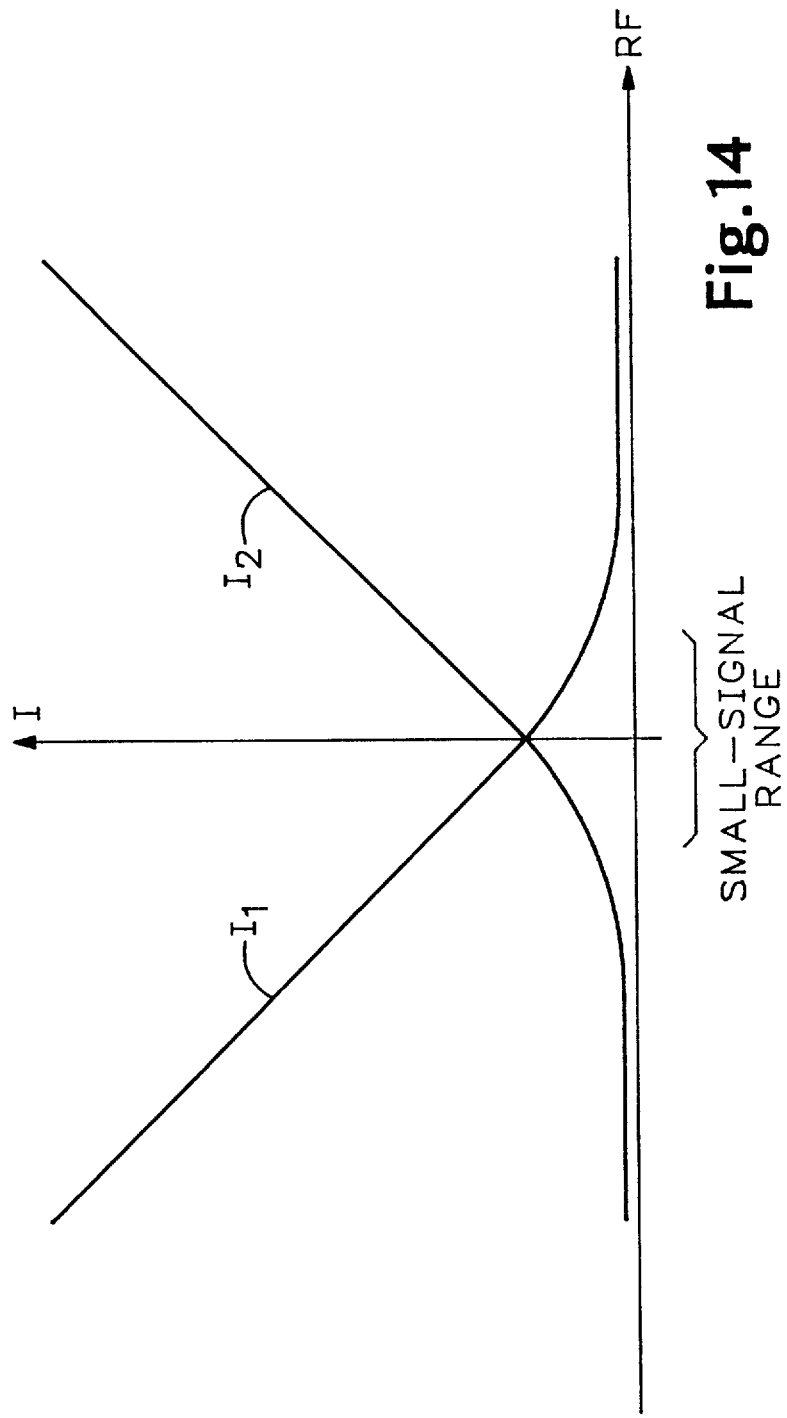

DOUBLE BALANCED RF MIXER WITH PREDETERMINED INPUT IMPEDANCE

BACKGROUND OF THE INVENTION

This invention relates generally to analog circuits and more particularly to radio frequency (RF) mixers.

Ever since the invention of the superheterodyne concept by Armstrong in 1918, mixers have been of critical importance in determining the overall performance of radio receivers, virtually all of which require at least one mixer. A mixer multiplies its signal inputs frequency-pair by frequency-pair, often producing very complex products in the process. From an input spectrum containing perhaps hundreds of competing signals at a receiver's antenna, only one of these frequency products should be passed by the selectivity-producing filters (at the IF) placed after the mixer. This one wanted signal is thereafter amplified, usually by a variable amount of gain—depending on the received signal strength—and the modulated information finally recovered by an appropriate detector.

A simple mixer is shown in FIG. 1; this prior art mixer is known as a singly-balanced mixer. The singly-balanced mixer 10 includes a differential pair of transistors (Q2, Q3) and a common-base transistor (Q1) connected to the emitters thereof. A constant current source 12 is connected in series with common-base transistor Q1 to provide a quiescent current to the mixer 10. This quiescent current ($I_z$) is the current flowing through the common-base transistor Q1 when no RF signal is applied to an RF input terminal 14 coupled between the common-base transistor Q1 and the current source 12.

The mixer 10 includes a local oscillator interface 16, which includes two input terminals, each connected to the base of a respective transistor in the differential pair, to which a local oscillator voltage (LO) is applied. The LO voltage is ideally a square wave, but is closer to a sinusoidal waveform at typical operating frequencies. In the absence of an RF input signal, the oscillation of the local oscillator voltage LO causes the quiescent current $I_z$ to commutate between the two transistors (Q2, Q3) of the differential pair. This commutation action produces an output signal (IF) that includes sum and difference frequencies.

The RF input signal is typically a signal having a frequency between 1 MHz to several GHz. As described above, this RF signal is "mixed" with the local oscillator voltage to produce the IF output signal. The RF input voltage $V_{RF}$ produces an input current $I_{RF}$ into node 18 between the common-base transistor Q1 and the constant current source 12. The current through the transistor Q1 ($I_{Q1}$) is thus the difference between $I_z$ and $I_{RF}$. Accordingly, as the input current $I_{RF}$ changes the current though transistor Q1 is modulated thereby.

Unfortunately, the relationship between the current $I_{Q1}$ and the input current $I_{RF}$ is nonlinear. Even small amplitudes of the input voltage $V_{RF}$ can produce large nonlinearities in the variations in the transistor current $I_{Q1}$. Ultimately, when the input voltage $V_{RF}$ reaches a certain magnitude, the mixer 10 effectively operates as a halfway rectifier due to transistor Q1 cutting off on positive excursions of $V_{RF}$. This nonlinearity of the common-base transistor Q1 produces unacceptable levels of intermodulation distortion in the IF output signal.

Another problem with the singly-balanced mixer is that a separate notch or band stop filter is needed to remove the local oscillator component from the IF signal. Another prior art mixer design, the so-called doubly-balanced mixer, as shown generally at 20 in FIG. 2, eliminates the need for the band stop filter by using two differential pairs cross-coupled so as to cancel the local oscillator component from the IF output signal. The operation of the doubly-balanced or "Gilbert" mixer, as it is known in the art, is well known. Although the Gilbert mixer does cancel the local oscillator component in the IF output signal, it does little to improve the basically-nonlinear performance of the singly-balanced mixer 10 of FIG. 1. Moreover, the Gilbert mixer requires a matching network at its RF input to achieve low noise.

Accordingly, a need remains for a mixer having improved linearity, i.e., low intermodulation distortion, good input matching and low noise.

SUMMARY OF THE INVENTION

It is, therefore, an object of the invention to provide a mixer having improved linearity over the above-described prior art mixers.

The mixer according to the invention has the potential of becoming a new standard for integrated-circuit mixers. The mixer provides exceedingly good linearity while maintaining a simple and elegant design. The mixer includes a mixer core having an LO interface for receiving a local oscillator signal, an IF output for providing an IF output signal, and first input and second inputs for connecting to an RF input section. The RF input section includes a bias input for receiving a bias signal, either a current or a voltage, and an RF input for receiving an RF input signal. The RF input section includes a first transistor having a first terminal coupled to the first input of the mixer core to supply a first current thereto, the first current being responsive to the RF input signal, a second terminal coupled to the bias input, and a third terminal coupled to the RF input. The RF input section also includes a current mirror coupled to the third terminal of the first transistor and to the second input of the mixer core to supply a second current to the mixer core, the second current being the complement of first current for small RF input signal variations. The mixer further includes a biasing circuit having a bias output coupled to the bias input of the RF input section for supplying the bias voltage to the RF input section to establish a quiescent level of the first current. As will be shown below, this biasing circuit can take many forms.

The mixer also includes means for providing a predetermined input impedance to the RF input signal. This impedance means includes a combination of biasing and resistances interposed between the RF input, the first transistor, and the current mirror.

An advantage of the present invention is that it can be realized in a number of different semiconductor processes including bipolar as well as complementary metal oxide semiconductor (CMOS).

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 14 is a plot of the first and second currents in the RF input section of FIG. 3 showing the complementary nature of the currents for small variations of the RF input signal, and the "Class AB" behavior for large variations of the RF input signal.

DETAILED DESCRIPTION

Figure 3:
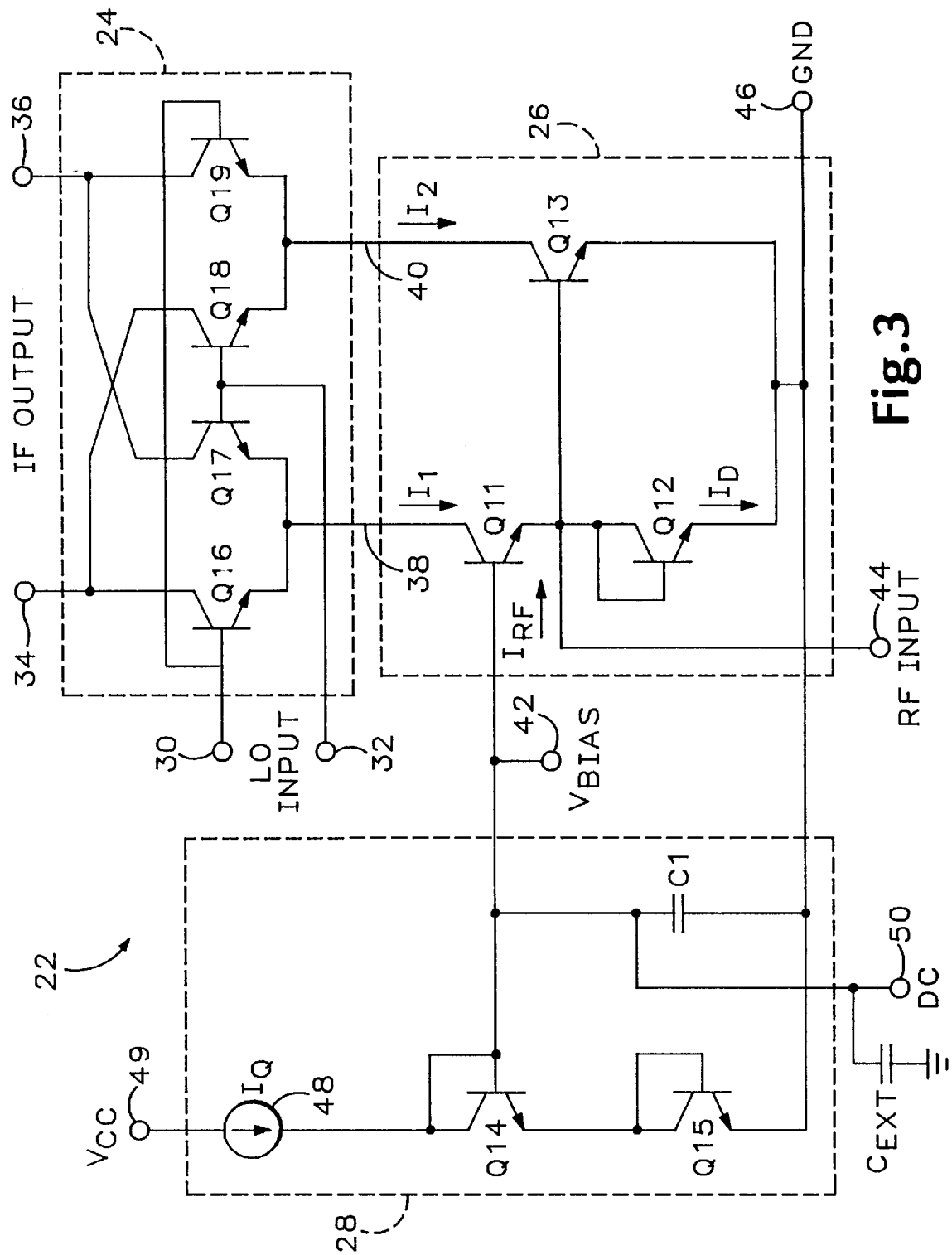
FIG. 3 is a schematic drawing of a basic mixer form according to the invention.

Referring now to FIG. 3, a mixer 22 according to the invention is shown. The mixer 22 includes a mixer core 24, an RF input section 26, and a biasing circuit 28. The mixer core includes a local oscillator (LO) interface for receiving a local oscillator signal (LO). The LO interface includes input terminals 30 and 32. The mixer core 24 also includes an IF output comprised of terminals 34 and 36 for providing an IF output signal (IF).

Figure 1:
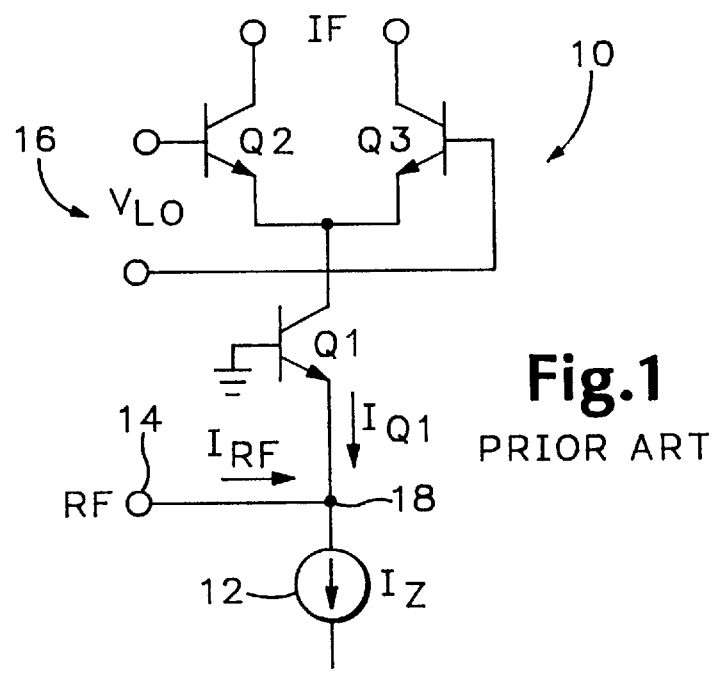
FIG. 1 is a schematic drawing of a prior art singly-balanced mixer.
Figure 2:
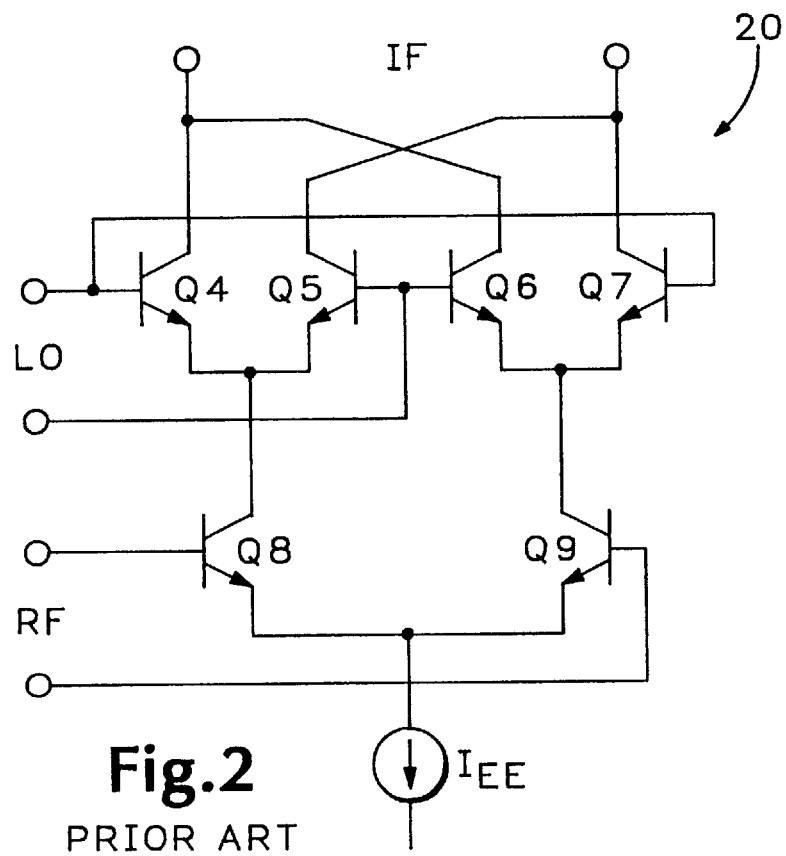
FIG. 2 is a schematic drawing of a prior art doubly-balanced mixer.

The mixer core 24 includes four transistors Q16–Q19 connected as in the prior art doubly-balanced mixer, i.e., Q4–Q7 respectively. The mixer core 24, rather than being coupled to a differential pair of transistors, as in FIG. 2, is coupled to the RF input section 26 of the invention. The RF input section 26 is coupled to the mixer core 24 at a first input 38 for supplying a first current ($I_1$) to a first differential pair (Q16–Q17) and a second input 40 for supplying a second current ($I_2$) to a second differential pair (Q18–Q19) of the mixer core 24. As will be described further herein below, the first and second currents are complementary for small RF input signal variations.

The RF input section 26 includes two primary components: a transistor (Q11), operating in a common-base configuration, and a current mirror (Q12–Q13). The transistor Q11 includes a first terminal connected to the first input 38 of the mixer core 24, a second terminal coupled to a bias input 42 of the RF input section 24, and a third terminal coupled to an RF input 44. In the preferred embodiment, transistor Q11 is a bipolar junction transistor (BJT), wherein the first, second, and third terminals correspond to the collector, base, and emitter, respectively. However, as will be described further below, the invention is not limited to bipolar junction transistors. The collector of the transistor Q11 provides the first current $I_1$ to the mixer core 24. The quiescent level of the first current $I_1$ is established by a bias voltage $V_{BIAS}$ supplied to the bias input 42 by the biasing circuit 28. A description of the biasing circuit 28 is included herein below. The emitter of transistor Q11 is coupled to the RF input 44 for receiving the RF input signal thereon. As in the case of the common base transistor of the singly-balanced mixer, the current through the transistor Q11 is directly responsive to the RF input signal.

The RF input section 26 also includes a current mirror comprised of transistors Q12 and Q13. Transistor Q12 is a diode-connected transistor having an anode coupled to the emitter of transistor Q11 and a cathode coupled to a common terminal 46 for receiving a common voltage, i.e., GND. The collector of transistor Q13 is coupled to the second input 40 of the mixer core 24 to supply the second current $I_2$ thereto. The base of transistor Q13 is coupled to the anode of the diode-connected transistor Q12 and the emitter of Q13 is coupled to the common terminal 46. As a result of this configuration, the voltage across the diode-connected to transistor Q12 is impressed upon the base-emitter junction of Q13. This results in the current through the diode-connected transistor $I_D$, i.e., approximately equal to $I_{RF}+I_1$ (ignoring the base current in Q11), being mirrored by current $I_2$.

In operation, the RF input section 26 produces two currents $I_1$ and $I_2$ that are complementary for small variations of the RF input signal applied to the RF input 44. This small-signal complementary relationship between the two currents $I_1$ and $I_2$ is shown in FIG. 14. As can be seen in FIG. 14, for small variations of the RF input signal, labeled small-signal range on FIG. 14, the currents $I_1$ and $I_2$ are complementary. Stated another way, for small signal variations the sum of $I_1$ and $I_2$ remain substantially constant. For large signal variations, however, currents $I_1$ and $I_2$ are not complementary but each becomes progressively a more linear function of the input currents. This extended signal range results in the improved large-signal linearity of the mixer.

The relationship between currents $I_1$ and $I_2$ shown in FIG. 14 ignores some of the practical effects of process variations and operating conditions such as finite β and supply voltage perturbations. These practical effects are addressed in turn herein below. However, before addressing those effects, the various embodiments of the biasing circuit of FIG. 3 are described.

Referring again to FIG. 3, the biasing circuit 28 is shown coupled to the bias input 42 for supplying the bias voltage $V_{BIAS}$ thereto. The bias voltage $V_{BIAS}$ establishes a quiescent level of the first current $I_1$ and the quiescent current in Q12 and Q13 in the RF input section 26. There are several embodiments of the biasing circuit 28 as shown herein in FIGS. 3–6. However, as will be apparent to those skilled in the art, many other embodiments are possible.

The biasing circuit 28 shown in FIG. 3 includes a current source 48, a first diode-connected transistor (Q14) in series with the current source, and a second diode-connected transistor (Q15) in series with the first diode. The current source 48 provides a current $I_Q$ to the diodes, thereby establishing a bias voltage $V_{BIAS}$ equal to the total voltage drop across the two diode-connected transistors Q14 and Q15. The magnitude of the current $I_Q$ is chosen to produce the desired voltage across the two diode-connected transistors. The current $I_Q$, in the preferred embodiment, is proportional to absolute temperature (PTAT). The voltage across each is equal to the base-emitter voltage ($V_{BE}$) which is a function of the collector current of the transistor. The two $V_{BE}$ voltage drops provide sufficient voltage to provide the voltage needed across transistors Q11 and Q12 of the RF input section to establish the quiescent bias currents.

The emitter area ratios of the diode-connected transistors in the biasing circuit (Q14, Q15) to the diode-connected transistor in the RF input section (Q12) can be modified to produce the desired relationship between $I_Q$ and $I_D$.

The biasing circuit 28 further includes a capacitor C1 coupled across the first and second diode connector transistors Q14 and Q15. The capacitor C1 ensures that the bias node has a low HF impedance. To further lower the bias node impedance an external pad 50 is coupled to the bias input 42 whereby an external capacitor $C_{EXT}$ can be coupled to the external pad 50. Typically, the external capacitor $C_{EXT}$ has a substantially larger capacitance (typically 0.1 $\mu$F) than the capacitance of the internal capacitor C1 (typically 20 pF).

Figure 4:
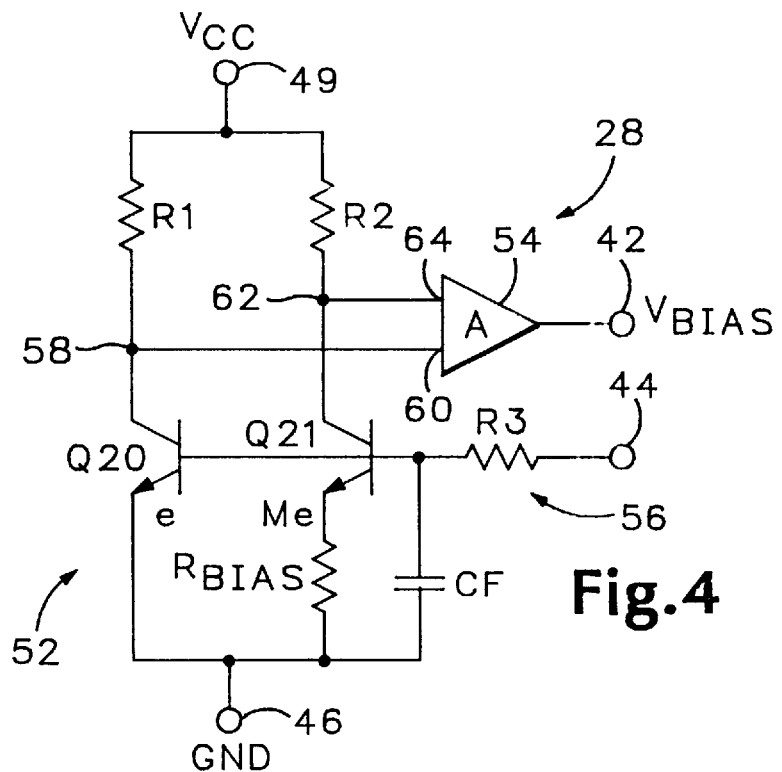
FIG. 4 is a schematic drawing of a first biasing circuit for the mixer of FIG. 3.

Referring now to FIG. 4, a second embodiment of the biasing circuit 28 is shown. This embodiment includes a proportional to absolute temperature (PTAT) cell, shown generally at 52, an operational amplifier 54, and a filter shown generally at 56. The PTAT cell 52 includes transistors Q20 and Q21 along with resistors R1, R2 and $R_{BIAS}$. The emitter areas of transistors Q20 and Q21 have a predetermined relationship. As shown in FIG. 4, the emitter area (Me) of transistor Q21 is M times the emitter area (e) of transistor Q20. It can readily be shown that this ratio produces a current ($I_{Q21}$) through the resistor $R_{BIAS}$ given by the following expression:

$$I_{Q21}=(V_T/R_{BIAS})\times 1n\, M$$

where $V_T$ is the thermal voltage (kT/q), which is approximately equal to 26 mV at 300° K. This current $I_{Q21}$ is thus proportional-to-absolute-temperature (PTAT).

The bases of transistors Q20 and Q21 are coupled to the RF input 44 via the filter 56. The filter 56, comprised of resistor R3 and capacitor CF, removes the RF signal and passes only the DC voltage present at the RF input 44. This allows the PTAT cell 52 to sense the DC voltage at the RF input 44. This DC voltage is impressed upon the base of transistor Q20, which thereby produces a corresponding current through resistor R1. The current R1 produces a corresponding voltage at node 58, which is provided to a first input 60 of the operational amplifier 54. The PTAT current through the transistor Q21, which is also dependent on the DC voltage, produces a corresponding voltage on node 62, which is presented to a second input 64 of the opamp 54. The opamp 54, which in the preferred embodiment may include only a few transistors, produces the bias voltage $V_{BIAS}$ responsive to the voltages appearing on input 60 and 64.

Figure 5:
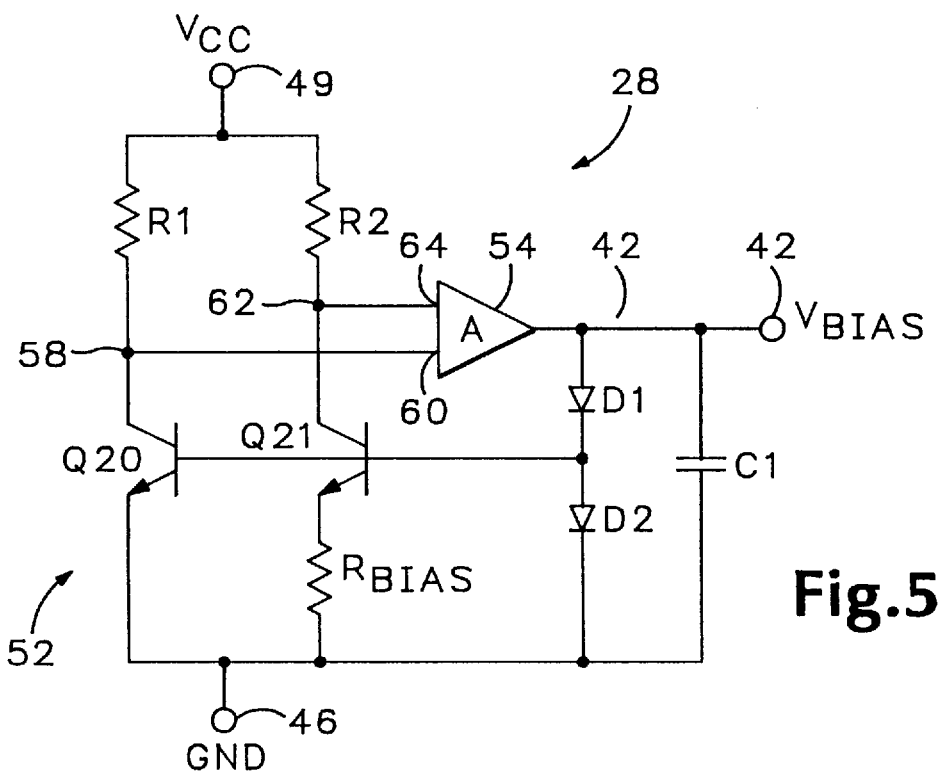
FIG. 5 is a schematic drawing of a second biasing circuit for the mixer of FIG. 3.

A third embodiment of the biasing circuit, shown in FIG. 5, adds two additional diodes D1 and D2 to the biasing circuit of FIG. 4. By using the diodes D1 and D2, the biasing circuit 28 can be decoupled from the RF input 44. Thus, the filter (resistor R3 and capacitor CF) of FIG. 4 is no longer required. The biasing circuit of FIG. 5 operates in substantially the same manner as the biasing circuit of FIG. 4, except that the voltage at the bases of transistors Q20 and Q21 is established by the voltage across diode D2 and not directly by the voltage across diode-connected transistor Q12 of the RF input section 26.

Alternatively, two resistors can be used in place of the two diodes D1 and D2 to establish the voltage at the bases of transistors Q20 and Q21. However, the diodes allow a lower current to be used to establish low operating impedances.

Figure 6:
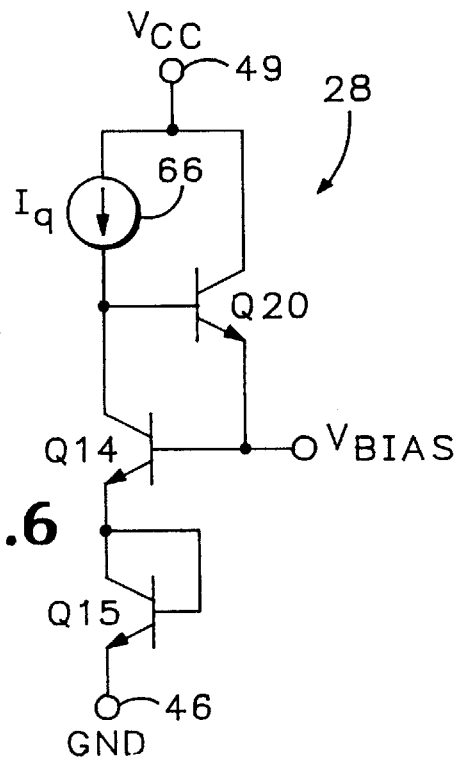
FIG. 6 is a schematic drawing of a third biasing circuit for the mixer of FIG. 3.

Referring now to FIG. 6, another embodiment of the biasing circuit 28 is shown. This embodiment uses a PTAT current instead of the base-emitter voltages to the bias voltage. The embodiment of FIG. 3 adds an emitter follower Q20 between the collector and base of the transistor Q14. By adding the emitter follower Q20 a smaller bias current $I_q$ can be used. The bias current $I_q$ is generated by a constant current source 66, which in the preferred embodiment is formed using a lateral PNP transistor.

In most semiconductor processes, PNP transistors have low current gain (i.e., β). As a result, only NPN transistors can be used where large currents are required. The biasing circuits of FIGS. 3–6 are examples of biasing circuits which use primarily NPN transistors to provide the needed current gain. The emitter follower Q20 provides the needed current gain to drive the base of transistor Q11 of the RF input section 26. Absent the emitter follower Q20, as in FIG. 3, the current source would have to supply significantly more current. This current requirement would foreclose the ability to use a lateral PNP to form the current source in most bipolar processes. In the preferred embodiment, the current source 66 supplies approximately 26 $\mu$A.

Because a significantly smaller current is flowing through the transistors Q14 and Q15, as compared to that flowing through transistors Q11 and Q12, the emitter area of transistor Q12 must be proportionally larger than the emitter area of Q50. In the preferred embodiment, the emitter area of Q12 is approximately ten times larger than that of Q50. This assumes a current through the transistor Q12 of approximately 260 $\mu$A. If a different quiescent value of this current is chosen, the ratio would be modified accordingly.

The biasing circuits shown in FIGS. 3–6 are but a few examples of a multiplicity of circuits that could be constructed to provide the bias voltage $V_{BIAS}$ to the RF input section. Those skilled in the art of analog circuit design can construct many other circuits which perform the same function, based on the description herein provided. In any practical realization, the device sizes of the transistors used in the RF input section 26 must be larger than those used in the biasing circuit to reduce the ohmoic resistances of the RF input section devices.

The following discussion describes several embodiments of the RF input section 26 of FIG. 3. These embodiments are shown in FIGS. 7–13. Each embodiment addresses a problem or limitation encountered in a practical implementation of the basic form of the RF input section 26 shown in FIG. 3. The embodiments shown in FIGS. 7–13 do not include the mixer core 24 or the biasing circuit 28 in order to focus on the particular modification to the basic form of the RF input section. In the complete realization of the mixer 22, however, both of these components are required. In addition, modifications to the basic biasing circuits shown in FIGS. 3–6 may need to be made to accommodate the changes to the RF input section described below, as will be apparent to those skilled in the art.

Figure 7:
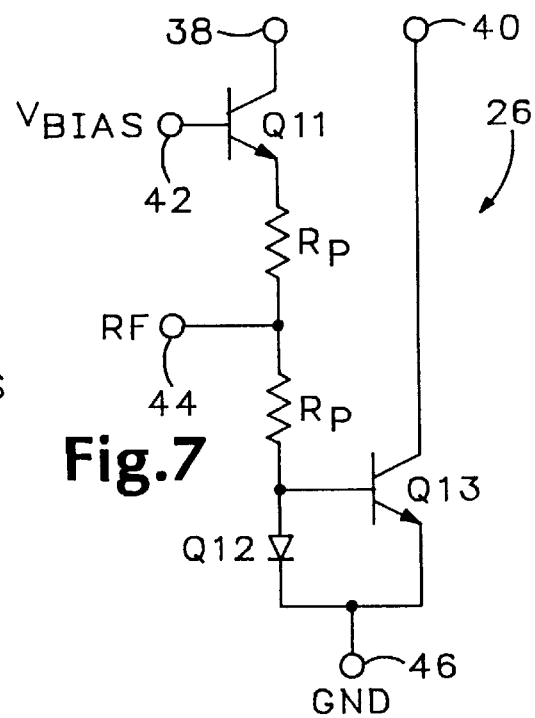
FIG. 7 is a schematic drawing of an RF input section for the mixer of FIG. 3.

Turning now to FIG. 7, a method and apparatus for providing a predetermined input impedance to the RF input signal for higher bias currents is shown. The method shown includes interposing a first padding resistor $R_P$ between the RF input 44 and the emitter of transistor Q11 and a second padding resistor $R_P$ between the RF input 44 and the anode of the diode-connected transistor Q12. The input impedance of each half-section is then equal to the sum of the padding resistance $R_P$ and the incremental resistance ($r_e$) of the transistors Q11 and Q12, respectively. The input resistance $Z_{IN}$ of the RF input section is the parallel combination of these resistances. Assuming the incremental resistance $r_e$ of the transistors Q11 and Q12 are equal, the input impedance $Z_{IN}$ is given by the following equation:

$$Z_{IN}=(r_e+R_P)/2$$

Assuming $Z_{IN}$ is set equal to 50 ohms and substituting $V_T/I_C$ for the incremental resistance $r_e$, the required value of the padding resistor $R_P$ is equal to the following expression:

$$R_P = 100 \text{ ohms} - V_T/I_c$$

where $I_c$ is here equal to the quiescent value of the current through transistors Q11 and Q12. The expression can then be used to select the optimal value of the padding resistance $R_P$ and the quiescent current $I_c$. In the preferred embodiment, $R_P$ is equal to 35 ohms and the current $I_c$ is equal to 397 µA.

It will be apparent to those skilled in the art that the biasing circuits shown in FIGS. 3–6 will need to be modified to account for the additional voltage across the padding resistors. To compensate for this voltage an additional resistor must be used in the biasing circuit to match the voltage across the padding resistor.

Figure 8:
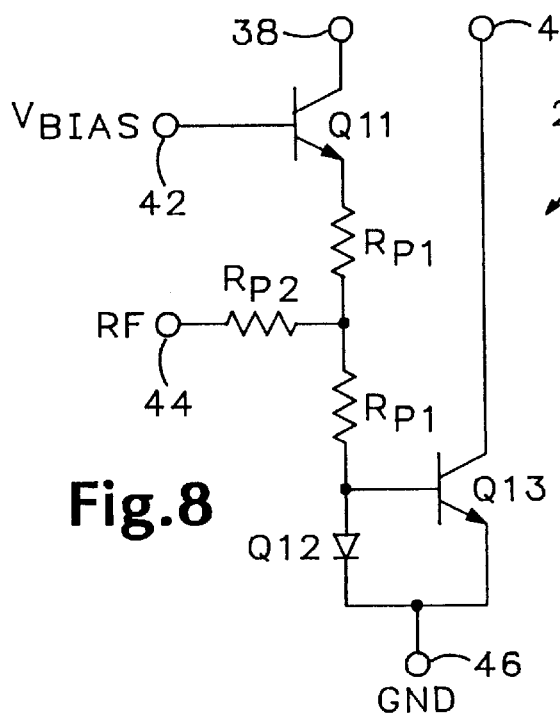
FIG. 8 is a schematic drawing of an RF input section for the mixer of FIG. 3.

Another method of providing predetermined input impedance is shown in FIG. 8. There a "Tee" resistance network is used. Here again, the values of resistors $R_{P1}$ and $R_{P2}$ are chosen to produce the desired input impedance, e.g., 50 Ω.

Figure 9:
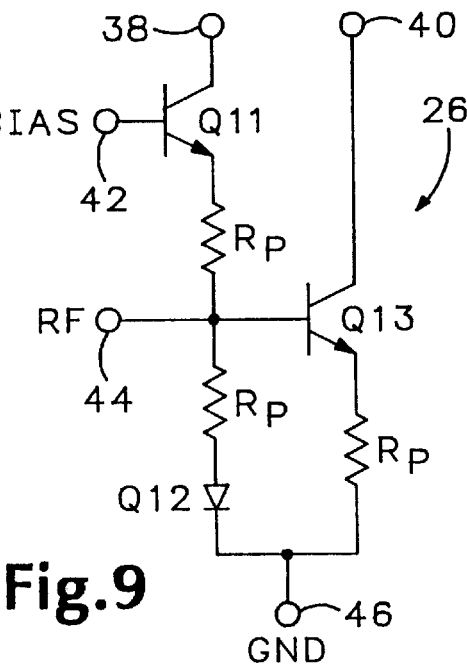
FIG. 9 is a schematic drawing of an RF input section for the mixer of FIG. 3.

The noise introduced by the current mirror transistor Q13 can be reduced by the introduction of an emitter degeneration resistor coupled between the emitter Q13 and the common terminal 46. This arrangement is shown in FIG. 9. In order to maintain the mirroring function of transistor Q13, the base of transistor Q13 is coupled to the RF input 44 and the emitter degeneration resistor $R_P$ has the same resistance as the padding resistor $R_P$ in series with the diode-connected transistor Q12. Alternatively, the positions of the diode-connected transistor Q12 and the second padding resistor $R_P$ can be interchanged, while still maintaining the mirroring function of transistor Q13.

Figure 10:
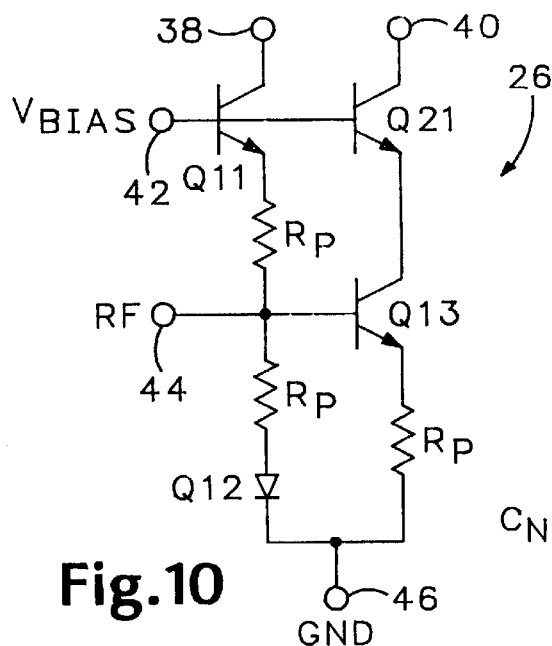
FIG. 10 is a schematic drawing of an RF input section for the mixer of FIG. 3.

A further embodiment of the RF input section 26 is shown in FIG. 10. The embodiment of FIG. 10 includes a cascode transistor Q21 interposed between the transistor Q13 and the second input 40 of the mixer core. The base of the cascode transistor Q21 is coupled to the bias input 42 of the RF input section to receive the bias voltage $V_{BIAS}$. The cascode transistor Q21 shields the mirror transistor Q13 from variations in the supply voltage. In addition, the cascode transistor Q21 helps to keep the needed sum of the base currents constat with variations in the signal currents, resulting in an essentially constant current required at the bias input 42. This is due to the complementary nature of the first and second currents provided to the mixer core by transistors Q11 and Q21, respectively, for small-signal conditions. The cascode transistor Q21 provides the further advantage of shielding the mirror transistor Q13 from spurious LO signals generated by the mixer core. Instead of being coupled to the mirror transistor Q13, LO signals from the mixer core are coupled to the bias input 42 via the parasitic capacitance between the base and collector of the cascode transistor and thus to the biasing capacitors $C_1$ and $C_{EXT}$, as shown in FIG. 3. This results in improved performance of the mixer.

Figure 11:
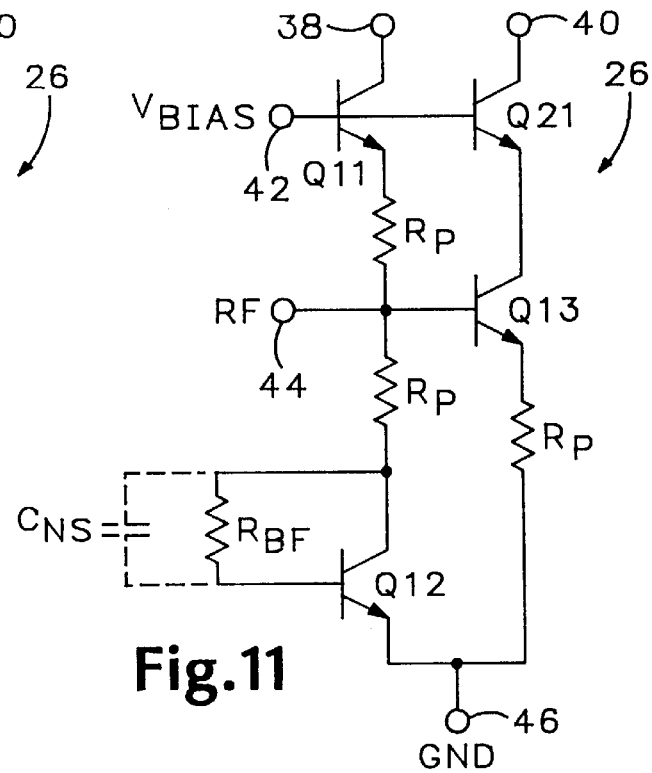
FIG. 11 is a schematic drawing of an RF input section for the mixer of FIG. 3.

A yet further embodiment of the RF input section 26 is shown in FIG. 11. The embodiment of FIG. 11 includes a resistor $R_{BF}$ interposed between the collector and base of the diode-connected transistor Q12 to improve the accuracy of the current mirror's gain in the presence of finite β. The resistor $R_{BF}$ raises the voltage at the base of transistor Q13, thereby increasing the current therethrough. It can be shown that the value of $R_{BF}$ is given by the following expression:

$$R_{BF} = 2 \times (r_e + R_P)$$

In the preferred embodiment, $R_{BF}$ is approximately 200 ohms. As a further modification, a noise suppressing capacitor $C_{NS}$ can be coupled in parallel with the resistor $R_{BF}$. Both components $C_{NS}$ and $R_{BF}$ are optional.

Figure 12:
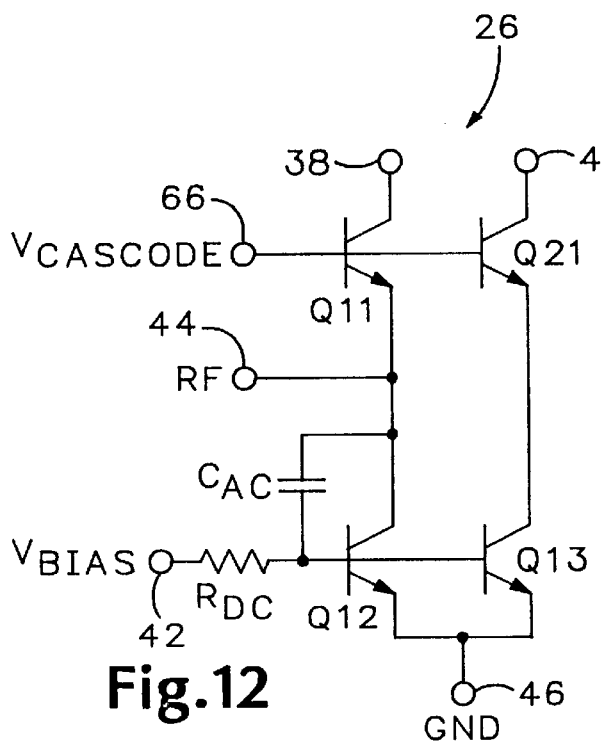
FIG. 12 is a schematic drawing of an RF input section for the mixer of FIG. 3.

Referring now to FIG. 12, another embodiment of the RF input section 26 is shown. This embodiment includes a capacitor $C_{AC}$ interposed between the base and the collector of the diode-connected transistor Q12 to AC couple the base and emitter terminals of transistor Q12 at high frequencies. The value of the capacitance $C_{AC}$ is selected so that the transistor Q12 will effectively be a diode-connected transistor at the RF frequency range, typically 10 MHz to 1 GHz. In this embodiment, the bias voltage $V_{BIAS}$ is coupled to the base of transistor Q12 via a resistor $R_{DC}$. The resistor $R_{DC}$ blocks the RF component; an RF choke could be substituted for the purposes of DC biasing The transistors Q11 and Q21 are then biased by a separate cascode voltage $V_{CASCODE}$ at a second bias input 66. This embodiment provides for greater flexibility in establishing the cascode voltage $V_{CASCODE}$. As should be apparent to those skilled in the art, the embodiment of FIG. 12 can be modified in the manner as described above with reference to FIGS. 7–11 to overcome some of the limitations of the basic structure shown in FIG. 12.

Figure 13:
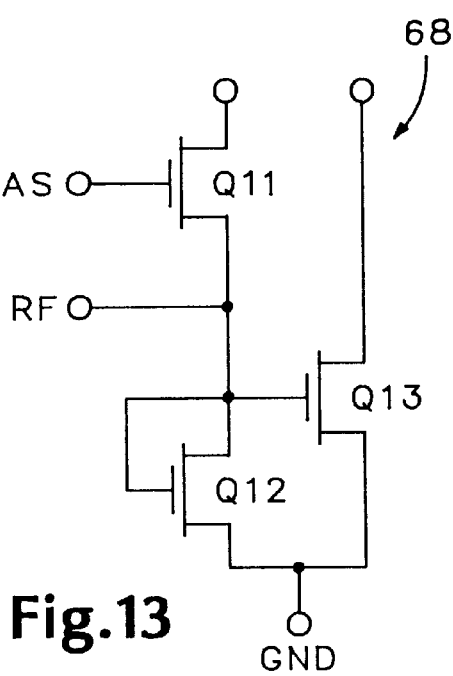
FIG. 13 is a schematic drawing of an RF input section for a mixer according to the invention using CMOS transistors.

As will be apparent to those skilled in the art, the invention described herein is not limited to the use of NPN bipolar transistors, nor to the use of a bipolar technology. Instead, a mixer according to the invention can be formed using any number of different semiconductor processes and different types of transistors. By way of illustration, FIG. 13 shows an RF input section 68 formed using field-effect-transistors (FET). The use of FETs in place of BJTs eliminates the need to compensate for errors due to base current in the bipolar case since no gate current is required by the FETs. Further, $g_m$ "degeneration" is usually not required. However, impedance is no longer simply a function of bias current: the input impedance now depends on both the bias current and device geometry. Accordingly, the analysis described above must be modified to account for the dependence on device geometry.

Having described and illustrated the principles of the invention in a preferred embodiment thereof, it should be apparent that the invention can be modified in arrangement and detail without departing from such principles. I claim all modifications and variation coming within the spirit and scope of the following claims.

I claim:

1. An RF mixer comprising:
   a mixer core having an LO interface for receiving a local oscillator signal, an IF output for providing an IF output signal, a first input, and a second input; and
   an RF input section having:
      a bias input for receiving a bias signal;
      an RF input for receiving an RF input signal;
      a first transistor having a first terminal coupled to the first input of the mixer core to supply a first current to the mixer core, the first current being responsive to the RF input signal, a second terminal coupled to the bias input, and a third terminal coupled to the RF input;
      a current mirror coupled to the third terminal of the first transistor and to the second input of the mixer core to supply a second current to the mixer core, the second current being the complement of the first current for small RF input signal variations; and
      a biasing circuit having a bias output coupled to the bias input of the RF input section for supplying the bias signal to the RF input section to establish a quiescent level of the first and second currents;

the current mirror including:
a diode having an anode coupled to the third terminal of the first transistor and a cathode coupled to a common terminal for receiving a common voltage; and
a mirror transistor having a first terminal coupled to the second input of the mixer core, a second terminal coupled to the anode of the diode, and a third terminal coupled to the common terminal;
wherein the diode includes a diode-connected transistor having a first terminal, a second terminal, and a third terminal, the first terminal being coupled to the second terminal to form the anode of the diode and the third terminal forming the cathode of the diode; and
wherein the RF input section further includes a resistive element interposed between the first terminal and the second terminal of the diode-connected transistor.

2. An RF mixer comprising:
a mixer core having an LO interface for receiving a local oscillator signal, an IF output for providing an IF output signal, a first input, and a second input; and
an RF input section having:
a bias input for receiving a bias signal;
an RF input for receiving an RF input signal;
a first transistor having a first terminal coupled to the first input of the mixer core to supply a first current to the mixer core, the first current being responsive to the RF input signal, a second terminal coupled to the bias input, and a third terminal coupled to the RF input;
a current mirror coupled to the third terminal of the first transistor and to the second input of the mixer core to supply a second current to the mixer core, the second current being the complement of the first current for small RF input signal variations; and
a biasing circuit having a bias output coupled to the bias input of the RF input section for supplying the bias signal to the RF input section to establish a quiescent level of the first and second currents;
the current mirror including:
a diode having an anode coupled to the third terminal of the first transistor and a cathode coupled to a common terminal for receiving a common voltage; and
a mirror transistor having a first terminal coupled to the second input of the mixer core, a second terminal coupled to the anode of the diode, and a third terminal coupled to the common terminal;
wherein the diode includes a diode-connected transistor having a first terminal, a second terminal, and a third terminal, the first terminal being coupled to the second terminal to form the anode of the diode and the third terminal forming the cathode of the diode; and
wherein the RF input section further includes a capacitor interposed between the first terminal and the second terminal of the diode-connected transistor.

3. An RF mixer comprising:
a mixer core having an LO interface for receiving a local oscillator signal, an IF output for providing an IF output signal, a first input, and a second input; and
an RP input section having:
a bias input for receiving a bias signal;
an RF input for receiving an RF input signal;
a first transistor having a first terminal coupled to the first input of the mixer core to supply a first current to the mixer core, the first current being responsive to the RF input signal, a second terminal coupled to the bias input, and a third terminal coupled to the RF input;
a current mirror coupled to the third terminal of the first transistor and to the second input of the mixer core to supply a second current to the mixer core, the second current being the complement of the first current for small RF input signal variations; and
a biasing circuit having a bias output coupled to the bias input of the RF input section for supplying the bias signal to the RF input section to establish a quiescent level of the first and second currents;
the current mirror including:
a diode having an anode coupled to the third terminal of the first transistor and a cathode coupled to a common terminal for receiving a common voltage; and
a mirror transistor having a first terminal coupled to the second input of the mixer core, a second terminal coupled to the anode of the diode, and a third terminal coupled to the common terminal;
wherein the diode includes:
a diode-connected transistor having a first terminal, a second terminal, and a third terminal, the first terminal being coupled to the second terminal to form the anode of the diode and the third terminal forming the cathode of the diode; and wherein the RF input section further includes:
a capacitor interposed between the first terminal and the second terminal of the diode-connected transistor, the first terminal of the diode coupled to the RF input of the RF input section and the second terminal of the diode coupled to a second bias for receiving a second bias signal.

4. An RF mixer comprising:
a mixer core having an LO interface for receiving a local oscillator signal, an IF output for providing an IF output signal, a first input, and a second input; and
an RF input section having:
a bias input for receiving a bias signal;
an RF input for receiving an RF input signal;
a first transistor having a first terminal coupled to the first input of the mixer core to supply a first current to the mixer core, the first current being responsive to the RF input signal, a second terminal coupled to the bias input, and a third terminal coupled to the RF input;
a current mirror coupled to the third terminal of the first transistor and to the second input of the mixer core to supply a second current to the mixer core, the second current being the complement of first current for small RF input signal variations; and
a biasing circuit having a bias output coupled to the bias input of the RF input section for supplying the bias signal to the RF input section to establish a quiescent level of the first and second currents:
the biasing circuit including:
a current source;
a first diode in series with the current source, the anode of the first diode being coupled to the bias output of the biasing circuit; and
a second diode in series with the first diode.

5. An RF mixer according to claim 4 wherein the biasing circuit includes a capacitor coupled across the first and second diodes.

6. An RF mixer according to claim 4 wherein the first diode includes a diode-connected transistor having a first terminal, a second terminal, and a third terminal, the first terminal being coupled to the second terminal to form the anode of the first diode and the third terminal forming the cathode of the first diode.

7. An RF mixer according to claim 6 wherein the biasing circuit further includes an emitter follower interposed between the first terminal and the second terminal of the diode-connected transistor.

8. An RF mixer comprising:
a mixer core having an LO interface for receiving a local oscillator signal, an IF output for providing an IF output signal, a first input, and a second input; and
an RF input section having:
 a bias input for receiving a bias signal;
 an RF input for receiving an RF input signal;
 a first transistor having a first terminal coupled to the first input of the mixer core to supply a first current to the mixer core, the first current being responsive to the RF input signal, a second terminal coupled to the bias input, and a third terminal coupled to the RF input;
 a current mirror coupled to the third terminal of the first transistor and to the second input of the mixer core to supply a second current to the mixer core, the second current being the complement of first current for small RF input signal variations; and
 a biasing circuit having a bias output coupled to the bias input of the RF input section for supplying the bias signal to the RF input section to establish a quiescent level of the first and second currents;
the biasing circuit including:
 a second transistor having a first terminal, a second terminal, and a third terminal coupled to a common terminal for receiving a common voltage;
 a first resistive element coupled between a supply terminal for receiving a supply voltage and the first terminal of the second transistor;
 a third transistor having a first terminal, a second terminal, and a third terminal;
 a second resistive element coupled between the supply terminal and the first terminal of the third transistor;
 a third resistive element coupled between the third terminal of the third transistor and the common terminal;
 means for biasing the second and third transistors; and
 an operational amplifier having a first input coupled to the first terminal of the second transistor, a second input coupled to the first terminal of the third transistor, and having an output coupled to the bias output of the bias circuit for supplying the bias signal.

9. An RF mixer according to claim 8 wherein the means for biasing the second and third transistors includes:
a first diode coupled to the operational amplifier output; and
a second diode coupled in series with the first diode, the anode of the second diode being coupled to the second terminals of the second and third transistors to bias the same.

10. An RF mixer according to claim 8 wherein the means for biasing the second and third transistors includes:
a fourth resistive element coupled between the RF input of the RF input section and the second terminals of the second and third transistors; and
a capacitor between the second terminal of the third transistor and a common terminal.

11. An RF mixer comprising:
a mixer core having an LO interface for receiving a local oscillator signal, an IF output for providing an IF output signal, a first input, and a second input; and
an RF input section having:
 a bias input for receiving a bias signal;
 an RF input for receiving an RF input signal;
 a first transistor having a first terminal coupled to the first input of the mixer core to supply a first current to the mixer core, the first current being responsive to the RF input signal, a second terminal coupled to the bias input, and a third terminal coupled to the RF input;
 a current mirror coupled to the third terminal of the first transistor and to the second input of the mixer core to supply a second current to the mixer core, the second current being the complement of the first current for small RF input signal variations; and
 a biasing circuit having a bias output coupled to the bias input of the RF input section for supplying the bias signal to the RF input section to establish a quiescent level of the first and second currents:
wherein the current mirror includes:
 a diode having an anode coupled to the RF input and a cathode coupled to a common terminal for receiving a common voltage; and
 a mirror transistor having a first terminal coupled to the second input of the mixer core, a second terminal coupled to the RF input, and a third terminal coupled to the common terminal;
wherein the RF input section further includes:
 a first resistive element interposed between the cathode of the diode and the common terminal; and
 a second resistive element interposed between the third terminal of the mirror transistor and the common terminal;
wherein the RF input section further includes a cascode transistor having a first terminal coupled to the second input of the mixer core, a second terminal coupled the second input of the first transistor, and a third terminal coupled to the first terminal of the mirror transistor;
wherein the RP input section further includes a third resistive element interposed between the third terminal of the first transistor and the RF input;
wherein the diode includes a diode-connected transistor having a first terminal, a second terminal, and a third terminal, the first terminal being coupled to the second terminal to form the anode of the diode and the third terminal forming the cathode of the diode; and
wherein the RF input section further includes a resistive element interposed between the first terminal and the second terminal of the diode-connected transistor.

12. An RF mixer comprising:
a mixer core having an LO interface for receiving a local oscillator signal, an IF output for providing an IF output signal, a first input, and a second input; and
an RF input section having:
 a bias input for receiving a bias signal;
 an RF input for receiving an RF input signal;
 a first transistor having a first terminal coupled to the first input of the mixer core to supply a first current to the mixer core, the first current being responsive to the RF input signal, a second terminal coupled to the bias input, and a third terminal;

a current mirror coupled to the second input of the mixer core to supply a second current to the mixer core;

a first resistor coupled between the third terminal of the first transistor and a node;

a second resistor coupled between the current mirror and the node;

a third resistor coupled between the RF input and the node; and a biasing circuit having a bias output coupled to the bias input of the RF input section for supplying the bias signal to the RP input section to establish a quiescent level of the first and second currents.

13. An RF mixer circuit comprising:

a first differential pair of transistors coupled together at a first node for receiving a first current;

a second differential pair of transistors coupled together at a second node for receiving a second current;

a first transistor having a first terminal coupled to the first node to provide the first current thereto, a second terminal coupled to a bias terminal for receiving a bias signal, and a third terminal connected directly to a third node for receiving an RF input signal; and a current mirror connected directly to the third node and coupled to the second node to provide the second current thereto.

14. A circuit according to claim 13 wherein the current mirror includes:

a second transistor having a first terminal connected directly to the third node, a second terminal connected directly to a power supply terminal, and a third terminal coupled back to the first terminal, whereby the third transistor is configured as a diode; and a third transistor having a first terminal coupled to the second node, a second terminal connected directly to the second terminal of the second transistor, and a third terminal connected directly to the power supply terminal.

15. A circuit according to claim 14 further including a bias circuit coupled to the bias terminal for providing the bias signal thereto, the bias circuit including:

a current source coupled to the bias terminal;

a first diode-connected transistor connected directly to the bias terminal; and a second diode-connected transistor connected between the first diode-connected transistor and a power supply terminal.

\* \* \* \* \*

UNITED STATES PATENT AND TRADEMARK OFFICE
CERTIFICATE OF CORRECTION

PATENT NO. : 5,826,182
DATED : Oct. 20, 1998
INVENTOR(S) : Gilbert

It is certified that error appears in the above-indentified patent and that said Letters Patent is hereby corrected as shown below:

Column 4, line 14, "diode-connected to" should read --diode-connected--;
Column 9, Claim 3, line 63, "an RP input" should read --an RF input--;
Column 10, Claim 4, line 58, "currents:" should read --currents;--;
Column 12, Claim 11, line 24, "currents:" should read --currents;--;
Column 12, Claim 11, line 46, "the RP input" should read --the RF input-;
Column 13, Claim 12, line 14, "the RP input" should read --the RF input-.

Signed and Sealed this

Twenty-third Day of March, 1999

Attest:

Q. TODD DICKINSON

*Attesting Officer*   *Acting Commissioner of Patents and Trademarks*